United States Patent [19]

Clark et al.

[11] Patent Number: 5,083,092
[45] Date of Patent: Jan. 21, 1992

[54] STAND-ON TYPE RESISTANCE TESTER FOR ELECTROSTATIC DISSIPATING SHOE EQUIPPED PERSONS

[75] Inventors: Stephen S. Clark; Brian L. Palmer, both of Michigan City, Ind.

[73] Assignee: Dwyer Instruments, Inc., Michigan City, Ind.

[21] Appl. No.: 570,377

[22] Filed: Aug. 21, 1990

[51] Int. Cl.$^5$ .............................................. G01R 27/02
[52] U.S. Cl. ...................................... 324/693; 324/713
[58] Field of Search ....................... 324/693, 713, 722; 361/223, 224; 330/86

[56] References Cited

U.S. PATENT DOCUMENTS

| | | | |
|---|---|---|---|
| 2,784,376 | 3/1957 | Steele | 324/713 |
| 3,030,022 | 4/1962 | Gittleman | 330/86 |
| 3,082,381 | 3/1963 | Morril et al. | 330/86 |
| 3,631,262 | 12/1971 | Jarrett | 330/86 |
| 3,872,395 | 3/1975 | Holland | 330/86 |

FOREIGN PATENT DOCUMENTS

1064485 12/1983 U.S.S.R. .......................... 361/223

OTHER PUBLICATIONS

W. E. Anderson, Inc., One Page Bulletin entitled, Safe-T-OHM Shoe Tester, published in 1966, for its Model TM Shoe Tester.
W. E. Anderson, Inc., One Page Sheet entitled, Operating Instructions for Safe-T-OHM Shoe Tester, for its Model TM Shoe Tester, published in 1966.

*Primary Examiner*—Kenneth A. Wieder
*Assistant Examiner*—Maura K. Regan
*Attorney, Agent, or Firm*—Lee, Mann, Smith, McWilliams & Sweeney

[57] ABSTRACT

A shoe tester for use in environments where static electricity sparking must be eliminated between so called Electrostatic Dissipating (ESD) shoes and the floor, by personnel wearing a pair of such shoes, wherein the tester comprises a pair of metallic electrically conductive shoe plates secured together in spaced but side-by-side relation resting on such floor on insulated studs or the like, on which the person wearing the shoe stands with his shoes on the respective plates, and a "plug-in" electronic circuit for measuring the resistance of such person and the shoes, including a scale and a pointer arm associated with the tester for actuation by the circuit when electrically energized by any grounded 115 volt alternating current outlet available for indicating acceptable and unacceptable shoe resistances, wherein the circuit includes an amplifier arrangement that permits the resistance measurements to be made to be in the range of 2,000 megohms.

3 Claims, 4 Drawing Sheets

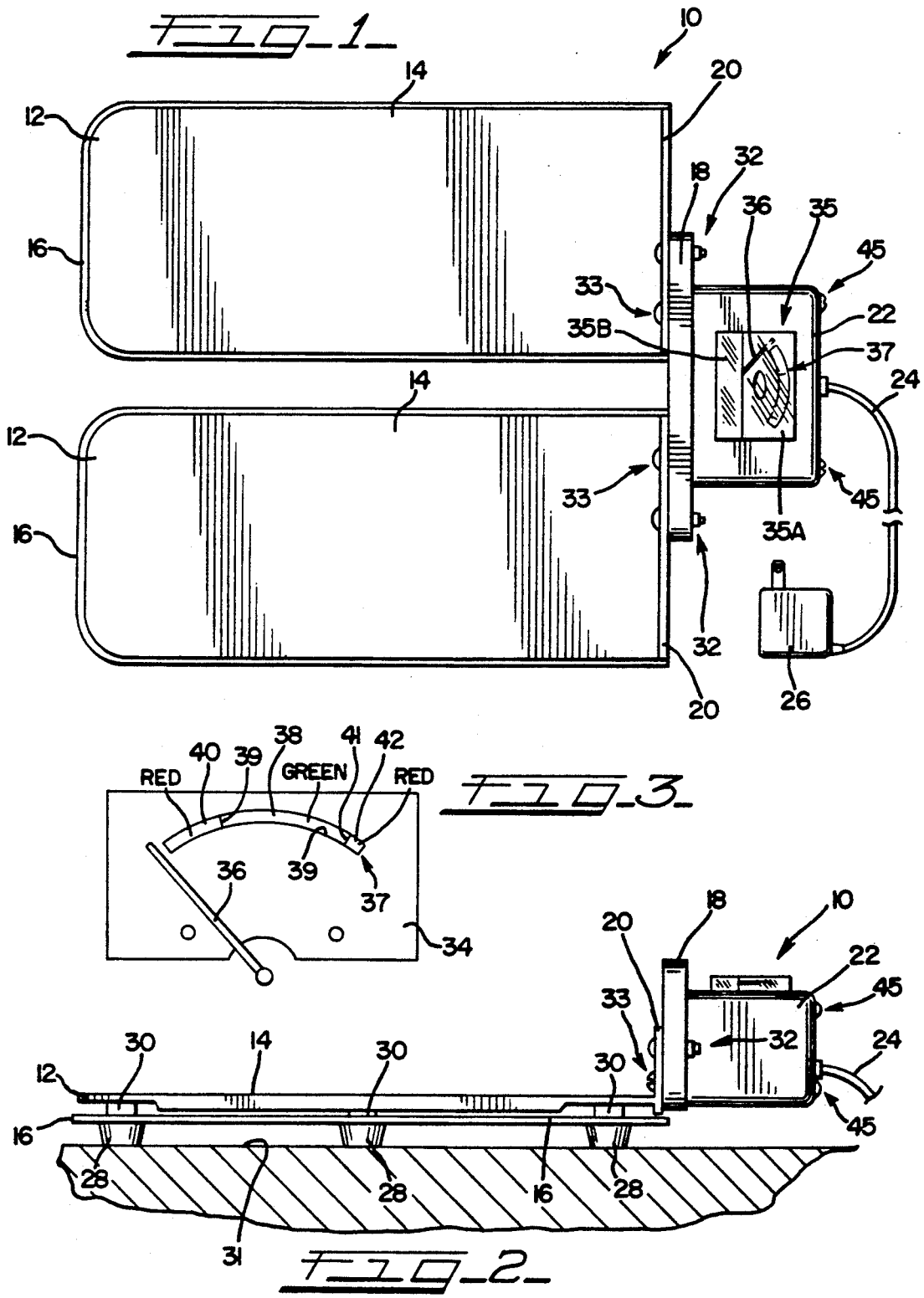

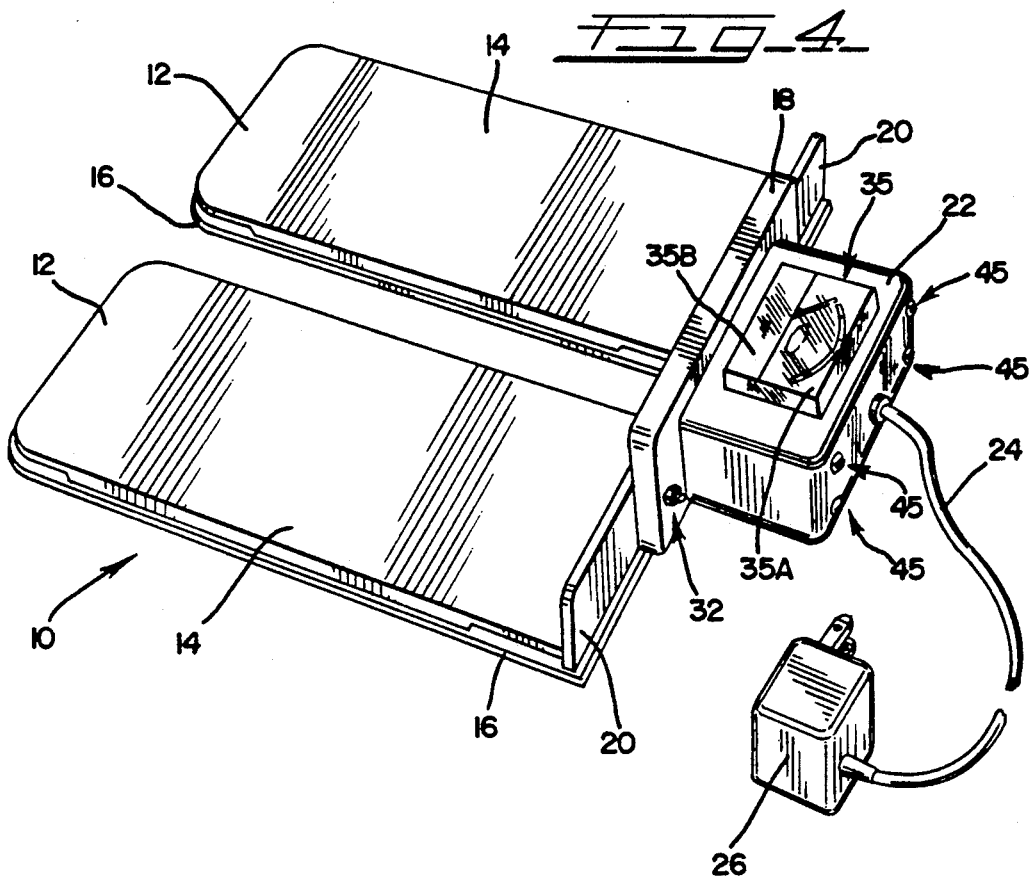
FIG_4
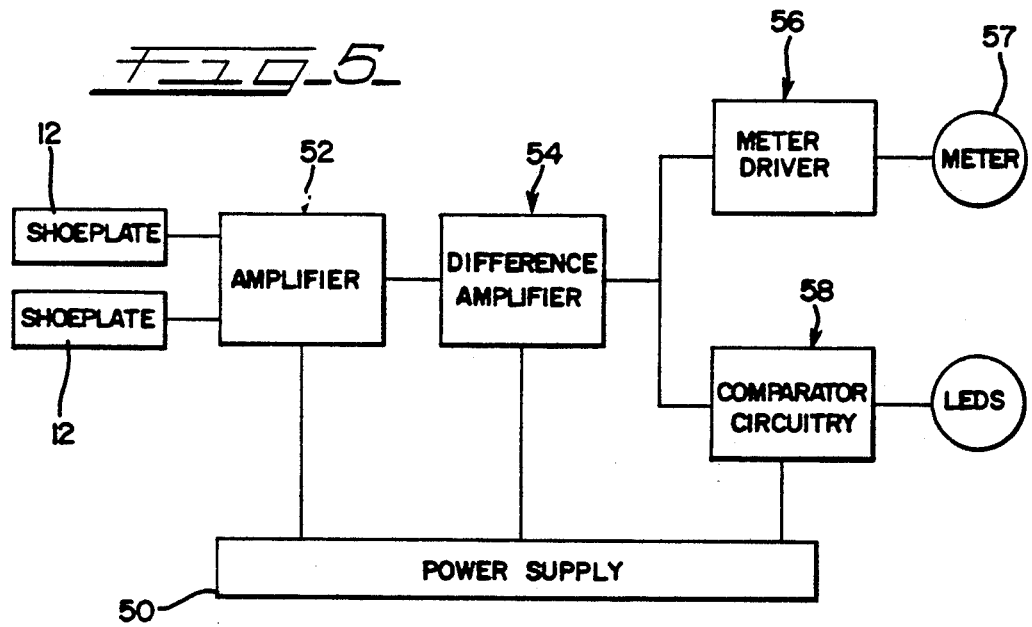
FIG_5

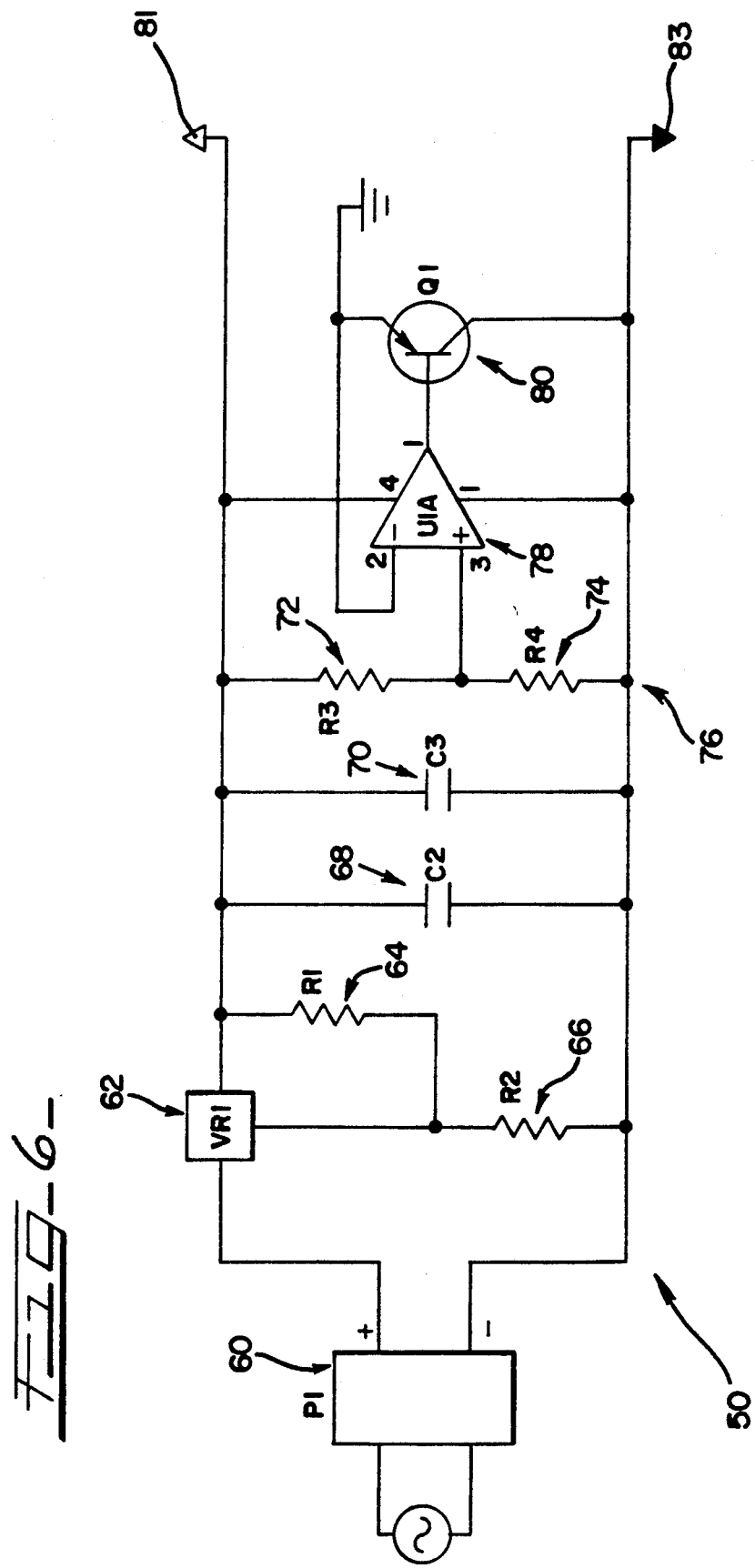

STAND-ON TYPE RESISTANCE TESTER FOR ELECTROSTATIC DISSIPATING SHOE EQUIPPED PERSONS

The present invention is directed to a stand-on type electrical resistance tester for electrostatic dissipating (ESD) shoe personnel wearers, and more particularly, to electrostatic dissipating shoe testers that may be used "on the spot" by personnel wearing a pair of such shoes to determine the approximate electrical resistance between the floor and such shoes in sensitive electro static dissipative environments.

Specialized footwear of an electrically protective nature are known to include so-called insulative or Electric Shock Resistant (ESR), Electrostatic Dissipating (ESD) footwear, and Conductive footwear. The ESR footwear category has a resistance range approximating infinity, the ESD footwear category has a resistance range of from approximately $10^6$ ohms to approximately $10^9$ ohms, while Conductive footwear category has a resistance range of approximately one megohm or less.

There are sites, as in hospital operating rooms, and locations where explosives are manufactured or handled, that are considered potentially explosive areas where a single electro static spark could possibly result in serious consequences. While Conductive shoes are available for personnel who work in such areas that provide spark preventative resistances up to about 1,000,000 ohms, the National Fire Protection Association continues to recommend that conductive footwear and other personnel-to-floor conductive devices be tested each time they are worn for use. One such tester that has been offered for some years is the Model TM, made and sold by Dwyer Instruments Inc. of Michigan City, Ind., see Bulletin entitled Safe-T-Ohm Shoe Tester.

Conventional shoe testers of this type that have been available are based on the proposition that the combined resistance of both shoes and the body of the person wearing same should be less than 1,000,000 ohms or 1 megohm, which level can still result in an undesirable spark generation, as experience has shown.

A principal object of the present invention is to provide an ESD shoe tester of this general type, for use in the ESD environments involved, with the same type of "plug-in" facility as the Dwyer Model TM shoe tester, which is of such increased sensitivity that it reliably measures resistance at the level of approximately 2,000 megohms.

In accordance with the present invention, the revised tester has the same basic hardware organization as the Dwyer Model TM shoe tester, including the pair of floor plates, the connecting bracket for same, a meter housing, a scale of the meter housing, a rotatably mounted indicator arm, that is to indicate acceptable and unacceptable resistance levels on the scale, and an electronic circuit suitably mounted within the housing and adapted to be electrically connected, plug-in style, to a convenient grounded 115 volt AC power outlet for electrically energizing the tester.

However, since devices of this type require the voltage involved to be applied to the body of the ESD shoe wearer, such voltage must be limited to a level that avoids injury to the shoe wearer. Until this invention, measurement of resistances for ESD shoes having a resistance of approximately 2,000 megohms has not been practical.

In accordance with the present invention, the electronic circuit, which is made up of commercially available, standard components, includes an amplifying arrangement that permits the testing current that the person wearing the shoes experiences, to be at a safe level, while measuring resistance of the shoes at the more desirable 2,000 megohm resistance level.

Yet other objects of the invention are to provide an ESD shoe tester that is a quality electronic instrument, that is precisely built, that provides heavy-duty polished aluminum foot plates, that is designed to give years of dependable service, that as acquired by the purchaser is complete and ready to operate and "plug-in" to any convenient 115 volt AC power source, and that is dimensionally small and light weight in character.

Other objects, uses, and advantages will be obvious or become apparent from a consideration of the following detailed description and the application drawings.

In the drawings:

FIG. 1 is a top plan view of the tester, showing the principal hardware components of same;

FIG. 2 is a side elevational view of the tester, taken from the bottom of FIG. 1;

FIG. 3 is a diagrammatic plan view of the scale plate that is mounted by the meter housing of the tester;

FIG. 4 is a top perspective view of the tester;

FIG. 5 is a block diagram view of the electronic circuit of the tester of this application;

FIG. 6 is a schematic illustration of the power supply circuit for the tester of this application.

Figure 7:
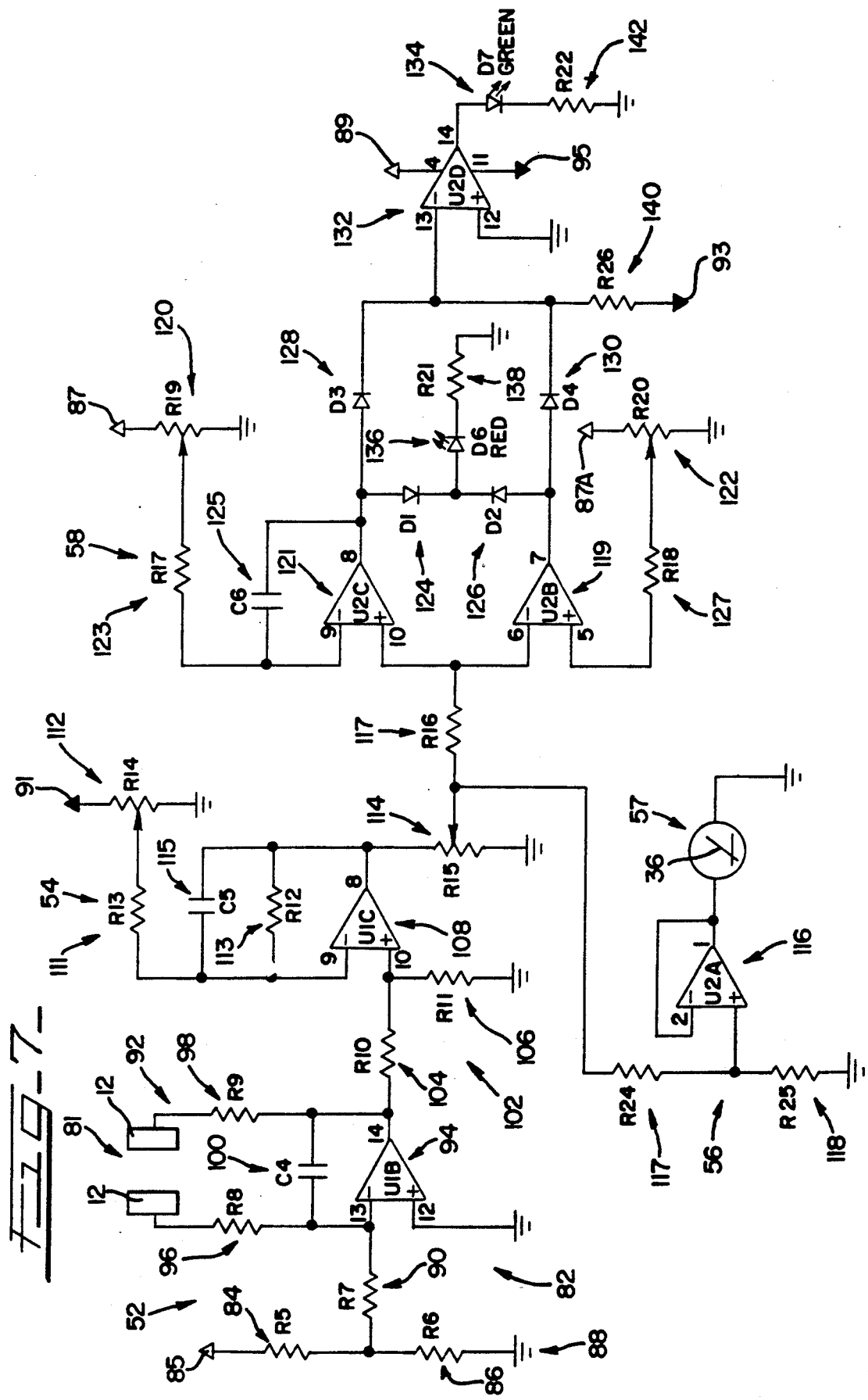
FIG. 7 is a schematic illustration of the tester circuiting that receives the power supply from the circuit of FIG. 6.

However, it is to be distinctly understood that the drawing illustrations referred to are provided primarily to comply with the disclosure requirements of the Patent Laws, and that the invention is susceptible of modifications and variations that will be obvious to those skilled in the art, and that are intended to be covered by the appended claims.

One form 10 of tester arrangement for ESD shoes, to which the invention is applicable, is diagrammatically illustrated in FIGS. 1–4. The tester 10 is there shown to comprise the usual pair of aluminum shoe plates 12, defining the respective highly polished surfaces 14, on which the person wearing the ESD shoes (not shown) to be tested stands (with one such shoe on each plate 12), a suitable tread plate 16 for each of the respective shoe plates 12, a connecting bracket 18 suitably connecting the upwardly angled ends 20 of the respective shoe plates 12 together so that the shoe plates 12 are disposed in the usual side-by-side relation, the meter housing 22 that is suitably affixed to the bracket 18 and contains the electronic circuiting involved, and the unit electrical energy input wiring 24 and plug 26 for electrically connecting the tester 10 to any grounded 115 volt alternating current (AC) power outlet that is available for use in using the unit 10.

As indicated in FIG. 2, the tread plates 16 are respectively suitably connected to the respective foot plates 12 by screws (not shown) anchoring rubber feet 28 to integral studs 30 of the respective foot plates 12, as is conventional. The indicated screws are suitably recessed within feet 28, and for each plate 12 there are several sets of the feet 28 and studs 30 so that the weight of the person wearing the shoes to be tested, on the respective foot plates 12 of device 10, is firmly supported from the floor 31 as to each shoe plate 12.

The bracket 18 may be fixed to the respective ends 20 of the respective foot plates 12 as by employing the conventional screw and nut devices or the like 32 that are illustrated in FIGS. 1, 2 and 4. As is conventional, the housing 22 is anchored to the bracket plate 18 and the ends 20 of the respective plates 12 by similar devices 33; housing 22 suitably bears scale plate 34 (see FIG. 3) and suitable covering 35 therefor (which is transparent as at 35A and opaque at 35B) with which suitably mounted pointer arm 36 cooperates, with the scale plate 34 defining a scale 37 in the form of a slot 39 struck on the radius of pointer arm 36 across which is suitably mounted a transparent medium having a colored (for instance, green) arcuate portion or area 38 indicating an acceptable resistance level, and at the ends of the scale area 38 (and on the same curvature) may be indexing lines 39 and 41 that start portions or areas 40 and 42 that are colored (for instance, red) to indicate unacceptable levels of resistance at either end of area 38. The scale 37 is preferably calibrated in megohms, and in accordance with the type of shoe tester involved, the electronic circuit of housing 22, which is wholly or partially suitably mounted on a suitable printed circuit board arrangement (that is suitably secured to and within housing 22), activates the pointer arm 36 by a suitable electrically responsive meter 57 (mounted in housing 22, see FIGS. 5 and 7) when the instrument plug 26 has been applied to a source of AC power of the type indicated. The device 10 is first allowed to "warm up", and thereafter an individual wearing ESD shoes stands on the respective shoe plates 12 in the manner indicated, preferably facing in the direction of housing 22, for test purposes. Cover portion 35A exposes the scale 37 and the portion of pointer arm 36 overlying same.

Incidentally, it is important that the soles of the shoes being tested be free of wax and dirt. Consequently, for tests, the soles of the shoes being tested should be suitably cleaned before test, and where the results are unsatisfactory, a cleaning of the soles may result in satisfactory test results. Similarly, if the surfaces 14 of the foot plates 12 become dirty, they should be cleaned with a damp cloth or polished with steel wool or fine sandpaper.

Housing 22 may be of any convenient conventional type, that shown illustrating conventional screws 45 for securing parts together.

The shoe tester hardware described and illustrated with reference to FIGS. 1-4 is basically conventional, that illustrated being the aforementioned Dwyer Model TM shoe tester. The improvement of the present application is concerned with the amplifier arrangement illustrated in FIGS. 5 and 7.

Referring to FIG. 5, the power supply circuit 50 of FIG. 5, which is also schematically illustrated in FIG. 6, supplies power to the amplifier circuit 52 (that is arranged in accordance with the present invention), a difference amplifier circuit 54, the conventional meter driver circuit 56 for conventional meter 57, and the comparator circuitry 58, which controls light emitting diodes (LEDS) that suitably cooperate with the scale plate 34 and pointer arm 36 in connection with the scale 37 to indicate the acceptable and unacceptable levels of resistance.

Assuming that a person wearing a pair of ESD shoes is standing on the device 10 in the manner indicated, and that the device 10 has its plug 26 applied to a conveniently located source of AC power of the category indicated (such as the familiar wall mounted plug-in type connector serving as a source of the commonly available 115 volt alternating current) and has "warmed up", for resistance test purposes, the electronic system involved works as follows:

Referring to FIG. 6, AC power is supplied to circuit 50 from the plug-in type power supply 60 afore-referred to that outputs a filtered, unregulated direct current (DC) at 18 volts. This output is fed into adjustable voltage regulator 62 that is conventionally programmed to output a regulated direct current at 16 volts, with external conventional resistors 64 and 66 being used in a voltage divider manner for this purpose. Capacitors 68 and 70 are conventional filter capacitors used to inhibit transient responses, while conventional resistors 72 and 74 form a voltage divider 76 that along with the operational amplifier 78 and transistor 80 form an approximate 8 volt direct current split power supply, the positive side 81 of which is suitably connected to amplifier circuit 52, as at 85 (see FIG. 7), and comparator circuitry 58, as at 87 and 87A (see FIG. 7), and operational amplifier 132 (see FIG. 7) that acts as a comparator; the negative side 83 is suitably connected to the difference amplifier circuit 54, as at 91 (see FIG. 7), and to the comparator circuitry, as at 93 and 95 (see FIG. 7).

The amplifier circuit 52 (see FIG. 7), which includes the measuring circuitry 81 involved in the arrangement of this application, which measuring circuitry 81 needs to be operably associated with the shoe plates 12 (of the tester 10); circuitry 81 is in the form of inverting amplifier 82. In the amplifier circuit 52 the resistors 84 and 86 form a voltage divider 88 that places approximately a 45 millivolt input signal across the range resistor 90. As indicated in FIG. 7, the plates 12 of the instrument 10 are located in the feedback loop 92 of the operational amplifier 94, with it being understood that the wearer of the ESD shoes being tested bridges the gap between the instrument plates 12, and thus the shoes being tested (it also should be understood that the feedback loop leads involved (see FIG. 7) are respectively connected to the tester foot plates 12 in any convenient manner, as will be understood by those skilled in the electrical-electronic arts). The gain of the operational amplifier 94 (during a test) is determined by the resistance between the shoes being tested and the respective plates 12, and the resistance range resistor 90. Changing of the value of the resistance of resistor 90 as desired provides the desired ranges of resistance that may be selected for the ESD shoes being tested. Resistors 96 and 98 are in series with the respective plates 12 for current limiting purposes, since the current is also being applied to the person wearing the shoes and needs to be at a safe (harmless to the person) level.

Capacitor 100 is placed in the feedback loop 92 of operational amplifier 94 to prevent the operational amplifier 94 from oscillating. For the specific circuiting illustrated in FIG. 7, the current passing between the plates 12 through the person wearing the ESD shoes being tested is approximately 200 nanoamperes at 5 volts DC.

This testing signal from the operational amplifier 94 is transmitted to voltage divider 102 formed by resistor 104 and grounded resistor 106, and thence into the noninverting input of difference amplifier 108, of the difference amplifier circuit 54. The difference amplifier 108 utilizes an offset voltage that has been suitably previously adjusted by suitably adjusting in a conventional manner zero potentiometer 112 (that is activated by circuit 50), which adjusted offset voltage has also been suitably corrected and stabilized as needed by resistors 111 and 113 and capacitor 115, and is inputed into the inverted input of the difference amplifier 108. The output from the difference amplifier 108 is then fed into the grounded span potentiometer 114, which has previously been adjusted to provide the desired signal that is then sent into the two circuits 56 and 58 that are used for indicating the resistance measured across the plates 12; the circuitry involved is conventionally arranged and adjusted so that the tester scale portions 38, 40 and 42 are illuminated when the meter indicator arm 36 is positioned over them (scale portions 40 and 42 may be simultaneously lighted from a single light emitting diode or the like using optical techniques or the like, as desired).

The circuit 56 (see FIG. 7) comprises voltage follower 116 that is activated by the signal through resister 117 that is conventionally employed to activate the conventional meter 57 that (is suitably grounded and) positions the indicated pointer arm 36 relative to scale 37 that provides the readout for the circuit 56 and in terms of megohms at the 2,000 megohm level.

A second readout circuit activated by the signal is circuitry 58 which is in the nature of a comparator circuit that actuates light emitting diodes 134 and 136 to indicate on scale 37 (as previously indicated) an acceptable or nonacceptable resistance condition for a particular pair of shoes tested. The signal for circuit 58 first passes through corrective resistor 117 and thereafter is supplied through operational amplifiers 119 and 121 to operational amplifier 132, with the circuitry 58 being designed to detect the presence of a voltage between the two indicated limits that have been previously set by the operator of the instrument, as by suitably adjusting potentiometers 120 and 122 as corrected by resistor 123, capacitor 125, and resister 127. The diodes 124, 126, 128 and 130 are employed to block the resulting signal involved from following the wrong path. The operational amplifier 132 is used as a comparator that looks for a voltage level within such limits and near zero volts (DC), and if found, the operational amplifier 132 outputs a voltage that turns light emitting diode 134 "on" that illuminates area 38 of scale 37. Resistor 140 is in the minus voltage supply line to insure that the amplifier 132 functions properly. If the signal outputted from operational amplifiers 119 and 121 for a particular test is outside such set limits, only the L ID 136 is turned "on", to illuminate areas 40 and 42 of scale 37. Resistors 138 and 142 are respectively provided to reduce or eliminate the ground directed current resulting, a desired by the designer.

As indicated, only the light emitting diode 134 is turned "on" when the operational amplifier 132 input signal is within the said limits of the device, while only the light emitting diode 136 is turned on if such signal involved is outside the said limits.

For reading purposes, the scale 37 as defined by the scale plate 34 may, of course use other distinctly different colors to indicate the acceptable and unacceptable levels of megohms that have been referred to, and, as already indicated, the diode 136 may be conventionally arranged to suitably light both areas 40 and 42 of the scale 37, at the option of the designer.

It will thus be seen that since the device 10 is to measure at a resistance level of approximately 2,000 megohms, it is necessarily a very sensitive instrument that requires low input current across the plates 12 and at a level that is safe for any one wearing the ESD shoes being tested. For this purpose it is preferred that the voltage across the plates 12 be in the range of from near zero voltage DC for the "plus" side to approximately 12 volts DC, with the current there involved being in the range of from approximately 1 nanoampere to approximately 1,000 nanoamperes.

The foregoing description and the drawings are given merely to explain and illustrate the invention and the invention is not to be limited thereto, except insofar as the appended claims are so limited, since those skilled in the art who have the disclosure before them will be able to make modifications and variations therein without departing from the scope of the invention.

I claim:

1. In an ESD shoe tester for use in resistance resting of ESD shoes as worn by a person in an electro static dissipative environment, wherein the tester includes a pair of metallic shoe plates each defining an upper polished shoe receiving surface on which the person wearing the ESD shows being tested stands, with the respective shoes, of the pair of ESD shoes being tested resting against the respective shoe plates, bracket means for connecting the shoe plates together in substantially parallel but spaced apart side-by-side relation, electrically insulating feet means carried by the plates for resting such plates on a floor for test purposes in such environment and in said side-by-side relation, a housing secured to the bracket, means, an electronic circuit mounted in said housing for measuring the resistance of such person and the pair of shoes being tested, with the housing including a scale portion having a coded scale indicating acceptable and unacceptable shoe resistance positions, and a pointer arm cooperating with the scale portion and actuated by the circuit, when electrically energized, to indicate one of the scale portion positions when the shoes are tested, and means for plug-in electrically energizing said circuit, the improvement wherein said circuit includes:

an amplifier circuit comprising an operational amplifier in which the shoe plates are electrically connected in spaced apart relation in the feedback loop of said operational amplifier, and means for utilizing the signal of said operational amplifier, when such ESD shoes, as worn by such person and standing as aforesaid on the tester plates for resistance testing of said ESD shoes, for disposing said pointer arm at one of said positions, with said operational amplifier being set to test said ESD shoe resistances at a level that approximates 2,000 megohms.

2. In an ESD shoe tester for use in resistance testing of ESD shoes as worn by a person in an electro static dissipative environment, wherein the tester includes a pair of metallic shoe plates each defining an upper polished shoe receiving surface on which the person wearing the ESD shoes being tested stands, with the respective shoes, of the pair of ESD shoes being tested resting against the respective shoe plates, bracket means for connecting the shoe plates together in substantially parallel but spaced apart side-by-side relation, electrically insulating feet means carried by the plates for resting such plates on a floor for test purposes in such environment and in said side-by-side relation, a housing secured to the bracket means, an electronic circuit mounted in said housing for measuring the resistance of such person and the pair of shoes being tested, with the housing including a scale portion having a coded scale indicating acceptable and unacceptable shoe resistance positions, and a pointer arm cooperating with the scale portion and actuated by the circuit, when electrically energized, to indicate one of the scale portion positions when the shoes are tested, and means for plug-in electrically energizing said circuit, the improvement wherein said circuit includes:
an amplifier circuit comprising an operational amplifier in which the shoe plates are electrically connected in spaced apart relation in the feedback loop of said operational amplifier, and means for utilizing the signal of said operational amplifier, when such ESD shoes, as worn by such person and standing as aforesaid on the tester plates for resistance testing of said ESD shoes, for disposing said pointer arm at one of said positions,
with said operational amplifier being set to test said ESD shoe resistances at a level that approximates 2,000 megohms,
and with the voltage across said plates being in the range of from approximately near zero volts DC to approximately twelve volts DC.

3. In an ESD shoe tester for use in resistance testing of ESD shoes as worn by a person in an electro static dissipative environment, wherein the tester includes a pair of metallic shoe plates each defining an upper polished shoe receiving surface on which the person wearing the ESD shoes being tested stands, with the respective shoes, of the pair of ESD shoes being tested resting against the respective shoe plates, bracket means for connecting the shoe plates together in substantially parallel but spaced apart side-by-side relation, electrically insulating feet means carried by the plates for resting such plates on a floor for test purposes in such environment and in said side-by-side relation, a housing secured to the bracket means, an electronic circuit mounted in said housing for measuring the resistance of such person and the pair of shoes being tested, with the housing including a scale portion having a coded scale indicating acceptable and unacceptable shoe resistance positions, and a pointer arm cooperating with the scale portion and actuated by the circuit, when electrically energized, to indicate one of the scale portion positions when the shoes are tested, and means for plug-in electrically energizing said circuit, the improvement wherein said circuit includes:
an amplifier circuit comprising an operational amplifier in which the shoe plates are electrically connected in spaced apart relation in the feedback loop of said operational amplifier, and means for utilizing the signal of said operational amplifier, when such ESD shoes, as worn by such person and standing as aforesaid on the tester plates for resistance testing of said ESD shoes, for disposing said pointer arm at one of said positions,
with said operational amplifier being set to test said ESD shoe resistances at a level that approximates 2,000 megohms,
and with the current across said plates being in the range of from approximately one nanoampere to approximately one thousand nanoamperes.

* * * * *